United States Patent [19]

Wagner et al.

[11] Patent Number: 5,235,424
[45] Date of Patent: Aug. 10, 1993

[54] AUTOMATIC GAIN CONTROL SYSTEM FOR A HIGH DEFINITION TELEVISION SIGNAL RECEIVER

[75] Inventors: Theodor M. Wagner, Princeton; Kevin M. Kelly, Bordentown, both of N.J.

[73] Assignee: General Electric Company, Princeton, N.J.

[21] Appl. No.: 832,126

[22] Filed: Feb. 6, 1992

[51] Int. Cl.⁵ .............................................. H04N 5/52
[52] U.S. Cl. ...................................... 358/174; 375/98; 455/245.1
[58] Field of Search ...................... 358/21 R, 174, 175, 358/176, 177, 178, 141, 142, 11, 12, 143; 375/17, 76, 98; 455/59, 60, 136, 138, 245.1, 245.2

[56] References Cited

U.S. PATENT DOCUMENTS

| | | | |
|---|---|---|---|
| 4,602,374 | 7/1986 | Nakamura et al. | 375/76 |
| 4,761,687 | 8/1988 | Rumreich | 358/174 |
| 4,989,074 | 1/1991 | Matsumoto | 358/174 |
| 5,043,805 | 8/1991 | Citta et al. | 358/83 |
| 5,134,464 | 7/1992 | Basile et al. | 358/12 |

OTHER PUBLICATIONS

"Hardware Implementation and Cost of Decoders for HDTV", T. Liu et al., IEEE Transactions on Consumer Electronics, vol. 7, No. 3, Aug. 1991.
General Instrument Corporation report on the Digicipher HDTV System, Jun. 8, 1990.
"Spectrum Compatible High Definition Television", C. G. Eilers et al., IEEE Transactions on Broadcasting, vol. 36, No. 1, Mar. 1990.

Primary Examiner—James J. Groody
Assistant Examiner—David E. Harey
Attorney, Agent, or Firm—Joseph S. Tripoli; Eric P. Herrmann; Ronald H. Kurdyla

[57] ABSTRACT

A high definition television receiver including analog and digital signal processing circuits receives an analog high definition television signal representative of digital television information. The received signal contains narrowband high priority information and low priority wideband information. An automatic gain control (AGC) signal is developed from the received analog signal by means of a root-mean-square amplitude detector.

3 Claims, 3 Drawing Sheets

AUTOMATIC GAIN CONTROL SYSTEM FOR A HIGH DEFINITION TELEVISION SIGNAL RECEIVER

FIELD OF THE INVENTION

This invention concerns apparatus in a television signal receiving system for automatically controlling the magnitude of a received television signal representative of digital image information.

BACKGROUND OF THE INVENTION

Standard television signal receiving systems typically include automatic gain control (AGC) apparatus for maintaining the magnitude of a signal applied to a detector stage substantially constant over a wide range of received signal levels. Such AGC apparatus typically generates an AGC voltage as a function of the amplitude of the horizontal sync component of a detected baseband video signal component. The AGC voltage is used to increase or decrease the gain of radio frequency (RF) and intermediate frequency (IF) amplifiers as an inverse function of the magnitude of the received television signal. Television signal AGC systems of this type are well known as described, for example, in U.S. Pat. No. 4,761,687—Rumreich.

Much attention has been devoted recently to the development of high definition television systems that encode and decode television information, e.g., image, audio and synchronizing information, in digital form. A transmitted digital television signal differs from a standard NTSC analog television signal in that it appears to be a random sequence of pulses, resembling a random noise signal of varying amplitude, and it may lack an RF carrier. Thus it may be difficult or impossible to use standard AGC techniques effectively for a digital television signal, due to the lack of an easily identifiable AGC reference component such as an RF carrier or a horizontal sync component similar to that of a standard NTSC television signal.

In recognition of these factors there is disclosed herein an AGC network suitable for use in a digital television signal receiving system. The disclosed AGC network is advantageously able to reject the effects of time varying interference phenomena such as aircraft induced flutter, and may be advantageously used in a high definition QAM digital television signal system having a spectrally shaped amplitude versus frequency response of the type shown in copending U.S. patent application Ser. No. 650,329 of Hugh Edward White. In that system, a transmitted high definition television signal lacking an RF carrier and an easily identifiable NTSC-type horizontal sync component is divided into high priority information that is intended to be received with high reliability, and low priority information. The high priority information and the low priority information are conveyed as separate QAM (quadrature amplitude modulated) carrier signals within different portions of the television signal frequency spectrum. The high priority information exhibits a narrower bandwidth and significantly larger amplitude than the low priority information.

SUMMARY OF THE INVENTION

Automatic gain control apparatus in accordance with the present invention is included in apparatus for receiving a digital television signal which may be representative of high definition image information. An automatic gain control signal is developed by means of a root-means-square (RMS) detector.

In an illustrated embodiment, the modulation spectrum of the digital television signal includes a narrowband component containing high priority information intended to be received with high reliability, and a wideband component containing low priority information. The two components are conveyed as separate QAM carrier signals within different portions of the television signal frequency spectrum. The RMS AGC detector derives the AGC signal from the narrowband QAM component of the digital television signal.

DETAILED DESCRIPTION

Figure 1:
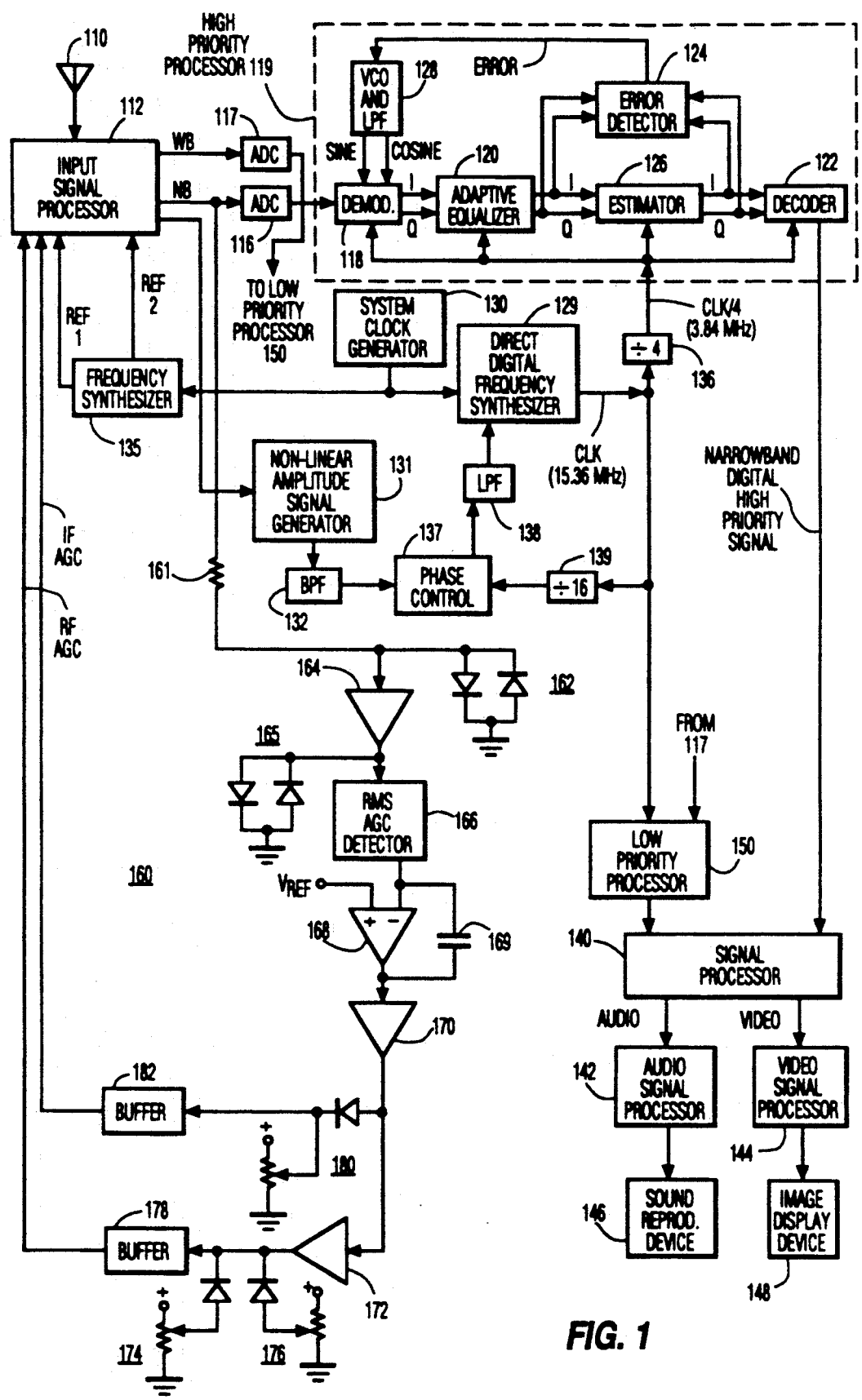
FIG. 1 is a block diagram of a portion of a digital television receiver including automatic gain control apparatus according to the present invention.
Figure 2:
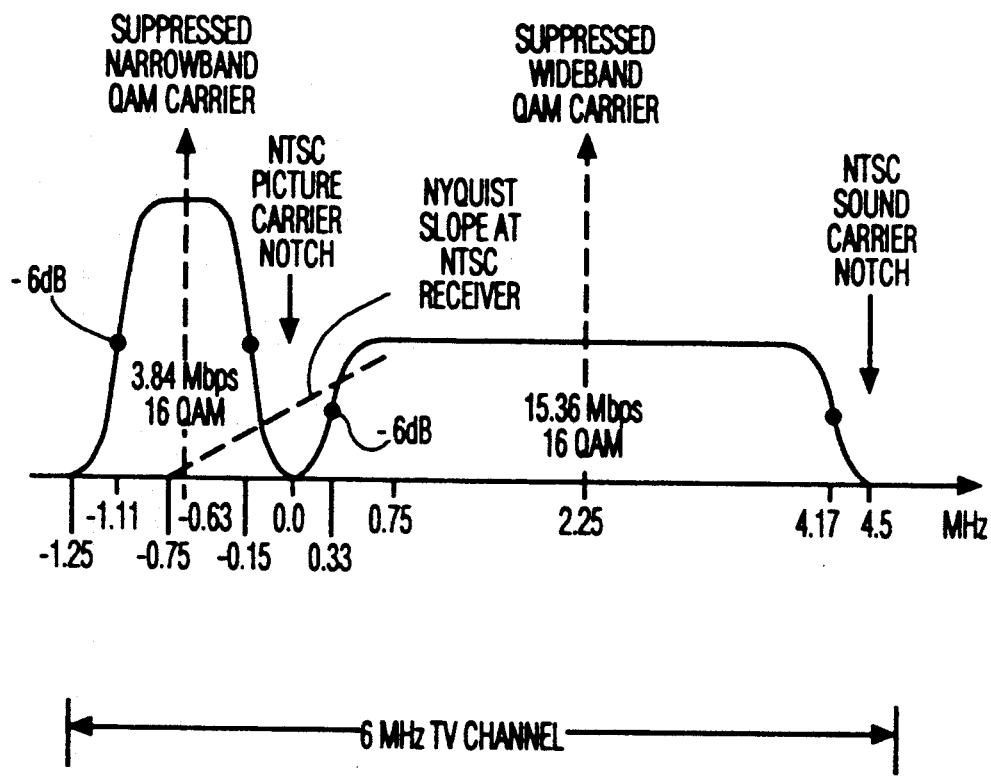
FIG. 2 depicts a baseband video frequency spectrum of a compatible simulcast multiple QAM high definition television signal received and processed by the receiver in FIG. 1.

FIG. 1 illustrates a portion of an HDTV receiver for receiving and digitally processing an HDTV signal of the type shown in FIG. 2. This signal will be described before proceeding with a discussion of the receiver arrangement shown in FIG. 1.

FIG. 2 illustrates the video frequency spectrum of a high definition television signal that is compatible with the 6 MHz bandwidth of a standard NTSC television signal channel, and that can be used as a simulcast signal. The frequencies along the frequency scale of FIG. 2 (−1.25 MHz to 4.5 MHz) are referenced to the 0.0 MHz frequency location of the RF picture carrier in a standard NTSC system.

The HDTV television signal is a data compressed signal divided into high and low priority information components. In this example audio, synchronizing and low frequency video information components that are intended to be received with high reliability are assigned a high priority. The synchronizing information, for example, may be in the nature of a training signal containing a unique signature or code to facilitate signal recovery and processing at a receiver, and illustratively may include field rate scanning information (e.g., start of field markers). Other less critical components, such as high frequency video information, are assigned a lower priority. The high priority information exhibits a narrow bandwidth relative to the low priority information, and narrowband quadrature amplitude modulates (QAM) a 0.96 MHz carrier. The low priority information wideband quadrature amplitude modulates a 3.84 MHz carrier. A resulting composite signal is a form of a multiple QAM signal, i.e., a "twin" QAM signal in this instance. The composite twin QAM signal has been translated into the 6 MHz standard television band by means of appropriate frequency translation at the transmitter, resulting in the spectrum shown in FIG. 2.

The amplitude of the narrowband QAM component is significantly greater than that of the wideband QAM component, twice as large in this example. The −6 db bandwidth of the narrowband QAM component is 0.96 MHz, and the −6 db bandwidth of the wideband QAM component is 3.84 MHz, or four times the bandwidth of the narrowband QAM component. The nonlinear band edge transition regions of the narrowband and wideband QAM components are shaped by finite impulse response (FIR) filters with a square root of a raised cosine characteristic, to produce smooth transition regions which avoid unwanted high frequency effects produced by sharp transition regions. The narrowband component exhibits an amplitude-versus-frequency characteristic with an excess bandwidth of approximately 17%, i.e., 17% more than the theoretical minimum bandwidth defined by the expression $$\frac{1}{2} \times \frac{1}{T}$$

where T is the symbol period for the subject signal. The amplitude-versus-frequency response of the wideband component in the band edge transition regions (not drawn to scale) has one quarter the slope of the steeper narrowband component.

The narrowband and wideband QAM components each contain an in-phase component "I" and a quadrature-phase component "Q". The I-phase component modulates a suppressed cosine carrier, and the Q-phase component modulates a suppressed sine carrier. A data "symbol" is represented by both the I component and the Q component. In the case of a 16 QAM signal, each I and Q component exhibits four discrete amplitude levels, resulting in a total of 4×4 or 16 possible amplitude levels, or values, for each of the narrowband and wideband QAM signals, hence "16" QAM. Two bits are needed to specify the four levels of each I and Q component, whereby each data symbol requires four bits to specify the sixteen levels for an I, Q combination. Thus the bit rate of the 3.84 MHz (−6 db) wideband QAM signal is 15.36 Mbps (3.84 MHz×4 bits), and the bit rate of the 0.96 MHz (−6 db) narrowband QAM signal is 3.84 Mbps (0.96 MHz×4 bits). In a 64 QAM system, the bit rates of the narrowband and wideband components would increase by a factor of 1.5. A 32 QAM modulation scheme could also be used and may be the preferred modulation mode because of inherent peak power limiting characteristics. The described multiple (twin) QAM signal exhibits significant co-channel immunity from interference associated with a standard NTSC television signal, i.e., an NTSC signal transmitted from a different location in the same channel as the twin QAM signal. Co-channel interference from the twin QAM signal into an NTSC signal also is reduced significantly.

The bit rates of the wideband and narrowband QAM signals, 15.36 Mbps and 3.84 Mbps respectively, advantageously exhibit a 4:1 integer relationship. This relationship simplifies recovering the narrowband and wideband QAM information at a receiver, since the same derived data clock can readily be used for timing the data recovery operation of both QAM components. The required data clock rates for the receiver system can be easily derived from the readily recovered high power narrowband QAM signal.

The receiver system of FIG. 1 basically corresponds to that described in the copending U.S. patent application of Hugh Edward White noted previously, except as to details of an input signal processor 112 and an AGC system 160 which will be described in detail subsequently. In the receiver system of FIG. 1, a broadcast twin QAM signal received by an antenna 110 is applied to input signal processor 112 including RF and IF stages as will be described in connection with FIG. 3. Processor 112 also receives reference signals REF 1 and REF 2 corresponding in frequency to reference signals used at the transmitter for developing the transmitted signal. Output signals from processor 112 include a wideband QAM component (WB) and a narrowband QAM component (NB) which are conveyed via respective analog-to-digital converters 117 and 116 to a high priority processor 119 and a low priority processor 150. The signal processed by processor 112 exhibits the composite modulation frequency spectrum shown in FIG. 2.

The digital sampled binary output signal from unit 116 is applied to a demodulator 118 which, together with elements 120, 122, 124, 126 and 128, forms narrowband QAM high priority signal processor 119. Narrowband QAM demodulator 118 includes an input filter having an amplitude versus frequency response characteristic which substantially conforms to the shape of the amplitude versus frequency characteristic of the modulated narrowband QAM component as shown in FIG. 2. The wideband output signal from unit 117 is applied to a wideband QAM low priority signal processing network 150 which includes elements similar to those found in the narrowband QAM high priority processor. Wideband QAM low priority processor 150 includes a demodulator with an input filter having a response that substantially conforms to the shape of the amplitude versus frequency characteristic of the modulated wideband QAM component shown in FIG. 2. Thus the receiver system exhibits signal attenuating notches at frequencies associated with high energy information in a standard definition television signal.

Adaptive equalizer 120, of conventional design, receives the demodulated quadrature phased I and Q components from demodulator 118. Equalizer 120 employs an adaptive digital FIR filter to compensate for amplitude and phase irregularities, e.g., including ghosts, caused by the transmission channel. In this example adaptive equalizer 120 is a so-called fractionally spaced equalizer that is capable of sampling over more than the minimum required intervals and therefore introduces whatever phase shift and amplitude changes are needed to produce desired amplitude and phase characteristics for the output I and Q components. Equalizer 120 includes a ROM programmed with desired phase and amplitude values for the I and Q output components of equalizer 120. The output I and Q component values are respectively compared with the programmed values, and the input I, Q values are adjusted to approximate the programmed values based on the results of the comparison. The adjustment is accomplished by changing the tap weights of filters associated with equalizer 120. Equalizer 120 is capable of subsampling within a symbol period to produce the amount of phase and amplitude change needed to produce the desired output amplitude and phase characteristics. As a result of this ability, the operation of equalizer 120 is substantially insensitive to the phase of an applied clock signal, although such phase preferably should be substantially constant. Equalizer 120 may be a synchronous equalizer, although a fractionally spaced equalizer exhibits better performance with respect to the phase characteristics of an applied clock signal. Fractionally spaced and synchronous adaptive equalizers are discussed in the text "Digital Communications", Lee and Messerschmitt (Kluwer Academic Publishers, Boston, Mass., USA, 1988).

Equalized I and Q output signals from unit 120 are applied to an estimator network 126 which produces output I, Q components representing a most likely estimate of the values of I and Q components as transmitted. For example, the values of the I and Q components at the output of estimator 126 have been adjusted as needed to compensate for the distorting effect of noise acquired in the course of transmission. Estimator 126 essentially performs an interpretive function of assigning values to samples which, due to effects such as noise, do not fit exactly into assigned locations in the 16-point four quadrant signal constellation. Output signals from estimator 126 are applied to a decoder 122, which essentially exhibits the inverse of a mapping operation performed by an encoder at the transmitter. Look-up tables are employed to "unmap" the four quadrant signal constellation into the sequential four-bit (symbol) segments, in binary digit form, which existed at the transmitter before being encoded at the transmitter.

An error detector 124 monitors the I, Q input and output signals of estimator 126 for producing a carrier phase error output signal with a magnitude proportional to the phase error between the input and output I and the input and output Q signals of estimator 126. The phase error can be due to noise effects, in which case the phase error would be random in nature. The phase error also can be due to the frequency of narrowband reference signal REF 2 (generated by frequency synthesizer 135) not being substantially equal to the frequency of a corresponding reference signal used at the transmitter, in which case the phase error would not be random in nature. An output ERROR signal from error detector 124 ultimately is used to compensate for the frequency of signal REF 2 deviating from a desired value, i.e., the value of the frequency of corresponding signal REF 2 at the transmitter. Error detector 124 operates at a higher sampling rate than equalizer 120, for sensing phase and frequency offsets that may be due to a frequency deviation attributable to synthesizer 135, or to a frequency deviation of a local oscillator associated with input processor 112.

Specifically, the ERROR signal is applied to a voltage controlled oscillator (VCO) network 128, including a low pass filter, for modifying the values of quadrature phased sine and cosine reference signals applied to quadrature demodulator 118. The modified sine and cosine reference signals alter the demodulation process until the magnitude of the error representative output signal from detector 124 indicates that any deviation of the frequency of signal REF 2 from a desired value has been compensated. The low pass filter associated with unit 128 filters the ERROR signal so that the values of the reference signals from VCO 128 and thereby the operation of demodulator 118 are modified in response to errors of a non-random nature, such as the described frequency deviation, and are unaffected by random effects such as noise. Wideband QAM low priority signal processor 150 contains elements that operate in the same fashion as units 118, 120, 122, 126, 124 and 128 of the narrowband QAM processor discussed above. Additional information concerning the operation of a control loop of the type including estimator 126, detector 124, VCO 128 and demodulator 118 can be found in the text "Digital Communication", by Lee and Messerschmitt, noted previously.

A signal processor 140 combines the demodulated high priority data signal from decoder 122 and the demodulated low priority data signal from processor 150. Processor 140 may include data decompression networks such as Huffman decoders and inverse quantizers, error correcting networks, and de-multiplexing and signal combining networks for providing separate audio and video television signal components. The audio component is processed by an audio signal processor 142 before being applied to a sound reproducing device 146. The video component is processed by a unit 144 to produce an image representative signal which is applied to an image display device 148.

A direct digital frequency synthesizer 129 produces a 15.36 MHz clock signal CLK in response to a master clock signal from a system clock generator 130, which also provides the master clock signal to a frequency synthesizer 135 for developing reference signals REF 1 and REF 2. The master clock signal from generator 130 is used to synchronize the operation of synthesizers 129 and 135, and exhibits a frequency of 10 MHz in this example. The frequencies of signals REF 1 and REF 2 nominally correspond to those of corresponding signals used at the transmitter. Any deviation of the frequencies of these signals from desired frequencies is compensated for as described above. Signal CLK from source 129 is the clock signal for digital signal processing circuits in low priority processor 150. The high priority narrowband processor processes a signal with a bandwidth that is one-fourth that of the wideband signal. Hence, the high priority processor elements respond to a clock signal CLK/4 with a frequency (3.84 MHz) one-fourth that of signal CLK, as provided by a frequency divider 136.

Figure 3:
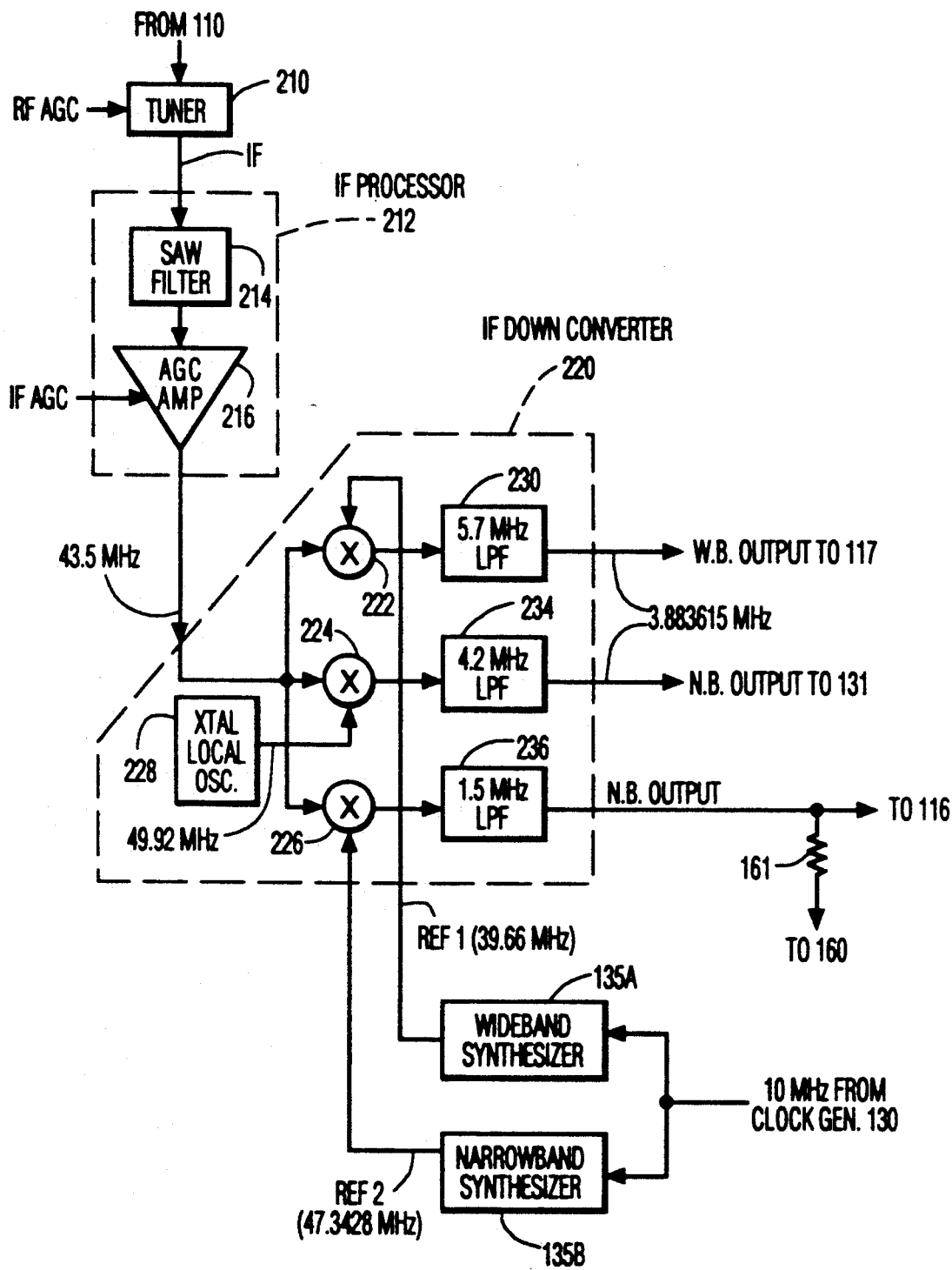
FIG. 3 shows details of an input signal processor in FIG. 1.

The frequency of clock signal CLK at the receiver corresponds to the frequency of a clock signal employed at the transmitter. Establishing the proper receiver clock frequency is facilitated by developing the receiver clock signal from information contained in the more reliably received high power narrowband QAM component as will be seen in FIG. 3. For this purpose a further narrowband output signal from input processor 112, as will be seen in FIG. 3, is applied to a nonlinear signal generator 131, e.g., a power of N generator such as a multiplier that multiplies the input by itself, where N may be 2 or 4. Unit 131 produces a single frequency component at the symbol rate of the narrowband QAM component. In this case the symbol rate is 0.96 MHz, one-quarter of the bit rate. Unit 131 also produces a highly attenuated output component at the symbol rate of the low power wideband QAM component, which output component is ignored by subsequent signal processing units.

The 0.96 MHz symbol rate output component from unit 131 is bandpass filtered by a filter 132 before being applied to a phase control unit 137 including a phase detector. Filter 132 has a center frequency at the 0.96 MHz symbol frequency. The bandwidth of filter 132 is not critical, but should be sufficient to provide an adequate signal-to-noise ratio. Phase control unit 137, responsive to the 0.96 MHz symbol rate output component from filter 132, forms a phase locked loop together with a low pass filter 138, synthesizer 129 and a divide-by-16 frequency divider 139. Filter 138 removes spurious frequencies including noise produced by the operation of nonlinear signal generator 131. Frequency divider 139 receives a 15.36 MHz signal from synthesizer 129 and provides a frequency divided 0.96 MHz output signal to a control input of phase detector 137. Synthesizer 129 includes a register which accumulates phase increments determined by the signal applied to a control input of unit 129 from filter 138, at a rate determined by the frequency of the signal from clock generator 130. The accumulated phase value addresses a ROM containing sinusoidal values which synthesize the output signal from unit 129. The function of unit 129 may be implemented with integrated circuit type Q2334 commercially available from Qualcomm Corporation of San Diego, Calif.

In this system the high priority component advantageously exhibits a narrow bandwidth with small (17%) excess bandwidth and sharp out-of-band attenuation, i.e., steep "skirts". The magnitude of the output signal from a nonlinear signal generator (e.g., multiplier) such as unit 131 in response to an input QAM signal is a function of the shape of the amplitude versus frequency characteristic of the input signal, particularly at the band edges. For a given passband amplitude characteristic, a steep slope at the band edge produces a small amplitude single frequency output component at the symbol rate of the input signal, whereas a shallow band edge slope produces a large amplitude output component.

The phase locked loop including elements 137, 138, 129 and 139 coact to maintain a substantially 0° phase difference between the 0.96 MHz input signal applied to phase control 137 from units 131 and 132, and the 0.96 MHz input signal applied to phase control 137 from frequency divider 139. The latter signal is developed by synthesizer 129 in response to a phase error representative control signal from filter 138.

Automatic signal gain control for the described system is provided by an AGC network 160. AGC Network 160 senses the demodulated (baseband) analog signal at the narrowband output of input signal processor 112, which is coupled to AGC network 160 via an isolation resistor 161. The sensed signal is amplitude limited by means of diode networks 162 and 165 preceding and following an amplifier 164 to prevent amplifier 164 from being overloaded by impulse noise and to further limit any impulse noise which may appear at the output of amplifier 164, respectively. An output signal from amplifier 164 is detected by a true root-mean-square (RMS) AGC detector 166, processed by a comparator 168 with an associated integrating capacitor 169 for developing a DC voltage representative of the detected output of unit 166, and amplified by a unit 170. A true RMS detector with an accuracy of approximately 0.1% is preferred over a standard RMS detector with an accuracy of 5-10%, although a standard RMS detector may produce acceptable results in the disclosed system. Comparator 168 develops an output signal representative of the difference between the level of the detected output signal from unit 166 and a reference voltage $V_{REF}$, and capacitor 169 integrates the comparator output signal applied to amplifier 170. Detector 166 may employ a commercial RMS detector device such as device type AD637 available from Analog Device Corp. of Norwood, Mass., USA.

AGC output signals from amplifier 170 are applied to RF and IF AGC inputs of input signal processor 112 via respective AGC paths. The RF AGC path includes an amplifier 172, thresholding networks 174 and 176, and a buffer 178 arranged as shown for conveying the RF AGC signal to the RF AGC input of unit 112. The gain of amplifier 172 may be adjusted to set the RF/IF AGC crossover point, sometimes referred to as the tuner AGC delay. Networks 174 and 176 respectively determine the high and low limits of the RF AGC range. The IF AGC path similarly includes a thresholding network 180 for determining the IF AGC operating range, and a buffer 182 for conveying the IF AGC signal to the IF AGC input of processor 112.

The RF and IF AGC signals developed by network 160 prevent the analog input signal to converter 116 from becoming large enough to overload converter 116 with attendant signal distortion and loss of information. The AGC signals also prevent the analog input signal to converter 116 from becoming so small as to compromise the performance of converter 116. To this end reference voltage $V_{REF}$ applied to comparator 168 assists to determine a desired AGC level.

RMS AGC detector 166 exhibits significant advantages with respect to noise immunity, AGC loop bandwidth, loop stability and suppression of time varying interference phenomena such as aircraft induced flutter effects. RMS detector 166 significantly reduces the amount of noise present in the RF and IF AGC paths, which permits the use of a wider AGC loop bandwidth with an associated ability to recover quickly from overloads and to reject aircraft flutter effects. Reduced control loop phase shift and increased loop stability also result.

RMS amplitude detector 166 is substantially insensitive to "pattern noise" associated with the modulating information representative of digital television information. Such pattern noise is due to the somewhat random data pattern of digital information, and is evident upon amplitude detection. The boise immunity of RMS detector 166 permits the use of a wide AGC control loop bandwidth, which advantageously permits the AGC network to closely track and reject fast varying interference phenomena such as aircraft induced "flutter". In this regard it is noted that commercial RMS detector type AD637 mentioned previously exhibits a wide bandwidth when driven by a large signal. Thus the gain of amplifier 164 should be set accordingly.

Impulse noise, which is stronger and more unpredictable than some other forms of noise, is also a factor in AGC design. Although impulse noise is less of a problem in a digital system compared to an analog system because the use of error correction networks in digital systems may prevent impulse noise from being visible in a displayed image, impulse noise can disturb system operation by overloading analog amplifiers prior to digital processing.

In the disclosed AGC system additional noise immunity is provided by diode limiter network 162, which limits impulse noise prior to baseband amplifier 164 to prevent amplifier 164 from being overloaded by impulse noise and to prevent RMS detector 166 from being influenced by impulse noise. Residual impulse noise is attenuated by means of diode limiter network 165, which further lessens the impact of impulse noise upon detector 166.

AGC network 160 maintains the input signal of converter 116 at a substantially constant level to assure proper operation of converter 116 as noted previously. The AGC network is biased so that, beginning with a very small input signal, the RF stage within processor 112 is kept at a high gain as long as possible for best signal-to-noise ratio. As the input signal level increases, the AGC network initially reduces the gain of the IF stage within processor 112 until at a predetermined level for larger signals the IF gain is held constant while the RF gain is reduced as a function of signal level.

FIG. 3 shows details of input signal processor 112 and frequency synthesizer 135 in FIG. 1. Input signals from antenna 110 are applied to a tuner section 210 which also includes a mixer for producing an intermediate frequency (IF) output signal in accordance with known signal processing techniques. An RF amplifier within tuner 210 is gain controlled in response to an RF AGC signal from AGC network 160 in FIG. 1. The IF output signal from tuner 210 is applied to an IF processor 212 including a SAW filter 214 having a bandwidth of approximately 6 MHz centered at 43.5 MHz, and an AGC amplifier 216 which is gain controlled in response to an IF AGC signal from AGC network 160.

An output signal from processor 212 is applied to an IF frequency down converter 220. Converter 220 includes signal multipliers (mixers) 222, 224 and 226, output low pass filters 230, 234 and 236, and a crystal controlled 49.92 MHz local oscillator 228, all arranged as shown. Multiplier 224 responds to a reference signal from oscillator 228 and to the output signal from processor 212. Multipliers 222 and 226 also respond to the output signal from processor 212, and to reference signal REF 1 and REF 2. The latter signals are developed by wideband synthesizer component 135A and narrowband synthesizer component 135B of unit 135 in FIG. 1, in response to the 10 MHz system clock signal. An output signal from filter 234 is applied to unit 131 in FIG. 1. Frequency down converted wideband and narrowband output signals from filters 230 and 236 are provided at outputs of filters 230 and 236, respectively.

What is claimed is:

1. In a system for receiving a television signal, apparatus comprising:

input signal processing means having an input for receiving an analog signal representative of digital television information, and an output;

digital signal processing means responsive to said output signal from said input signal processing means;

video signal processing means for providing an image representative signal in response to an output signal from said digital signal processing means; and automatic gain control means including a root-mean-square (RMS) amplitude detector means for developing a control signal as a function of the magnitude of a received signal for automatically controlling the magnitude of signals provided to said digital signal processing means; wherein said representative signal is representative of high definition digital television information and has a bandwidth compatible for a pre-existing standard definition television signal channel, and comprises a narrowband component containing high priority information and a wideband component containing low priority information;

said control signal is derived from said narrowband component; and said narrowband component is a quadrature amplitude modulation (QAM) signal.

2. In a system for receiving a television signal, apparatus comprising:

input signal processing means having an input for receiving an analog signal representative of digital television information, and an output;

digital signal processing means responsive to said output signal from said input signal processing means;

video signal processing means for providing an image representative signal in response to an output signal from said digital signal processing means;

automatic gain control means including a root-mean-square (RMS) amplitude detector means for developing a control signal as a function of the magnitude of a received signal for automatically controlling the magnitude of signals provided to said digital signal processing means; and impulse noise limiting means preceding said RMS amplitude detector means.

3. In a system for receiving a television signal, apparatus comprising:

input signal processing means having an input for receiving an analog signal representative of digital television information, and an output;

digital signal processing means responsive to said output signal from said input signal processing means;

video signal processing means for providing an image representative signal in response to an output signal from said digital signal processing means; and automatic gain control means including a root-mean-square (RMS) amplitude detector means for developing a control signal as a function of the magnitude of a received signal for automatically controlling the magnitude of signals provided to said digital signal processing means; wherein said control signal is applied to gain control inputs of RF and IF stages of said input signal processing means.

* * * * *

UNITED STATES PATENT AND TRADEMARK OFFICE
CERTIFICATE OF CORRECTION

PATENT NO. : 5,235,424

DATED : August 10, 1993

INVENTOR(S) : Theodor M. Wagner et al.

It is certified that error appears in the above-identified patent and that said Letters Patent is hereby corrected as shown below:

Title page, Item [73], change "General Electric Company" to
---RCA Thomson Licensing Corporation---.

Signed and Sealed this

Thirty-first Day of October 1995

Attest:

BRUCE LEHMAN

*Attesting Officer*   *Commissioner of Patents and Trademarks*